US010897232B2

(12) United States Patent
Horii (10) Patent No.: US 10,897,232 B2
(45) Date of Patent: Jan. 19, 2021

(54) MULTI-LEVEL CAPACITIVE DIGITAL-TO-ANALOG CONVERTER FOR USE IN A SIGMA-DELTA MODULATOR

(71) Applicant: ams AG, Premstaetten (AT)

(72) Inventor: Daisuke Horii, Tokyo (JP)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/614,957

(22) PCT Filed: Apr. 18, 2018

(86) PCT No.: PCT/EP2018/059892
§ 371 (c)(1),
(2) Date: Nov. 19, 2019

(87) PCT Pub. No.: WO2018/215141
PCT Pub. Date: Nov. 29, 2018

(65) Prior Publication Data
US 2020/0169228 A1 May 28, 2020

(30) Foreign Application Priority Data
May 24, 2017 (EP) .................... 17172738

(51) Int. Cl.
*H03F 3/00* (2006.01)
*H03M 1/80* (2006.01)
*H03M 3/00* (2006.01)

(52) U.S. Cl.
CPC ............ *H03F 3/005* (2013.01); *H03M 1/802* (2013.01); *H03M 3/424* (2013.01); *H03M 3/464* (2013.01)

(58) Field of Classification Search
CPC ...... H03M 3/424; H03M 3/464; H03M 3/342; H03M 1/802; H03M 1/66; H03F 3/005
(Continued)

(56) References Cited

U.S. PATENT DOCUMENTS

| 4,896,156 A * | 1/1990 | Garverick ............ G06G 7/1865 332/106 |
| 5,001,725 A * | 3/1991 | Senderowicz ...... H04L 25/0274 341/143 |

(Continued)

FOREIGN PATENT DOCUMENTS

| CN | 102694551 | 2/2015 |
| EP | 0903862 A1 * | 3/1999 ........... H03H 19/004 |

(Continued)

OTHER PUBLICATIONS

Geiger Randy: "EE 435 Lecture 44 Switched-Capacitor Amplifiers Other Integrated Filters", Jan. 2008 (Jan. 1, 2008), XP55672117, Retrieved from the Internet: URL: http://class.ece.iastate.edu/ce435/lectures/EE%20435%20Lect%2044%20/ Spring%202008.pdf Spring%202008.pdf.

(Continued)

*Primary Examiner* — Lam T Mai
(74) *Attorney, Agent, or Firm* — MH2 Technology Law Group LLP (57) ABSTRACT

A multi-level capacitive digital-to-analog converter, comprises at least one capacitor switch circuit (100) including a differential operational amplifier (130) having a first input node (E130a) and a second input node (E130b). A first current path (101) is coupled to a first reference input terminal (E100a) to apply a first reference potential (RefP) and the second current path (102) is coupled to a second reference input terminal (E100b) to apply a second reference potential (RefN). The at least one capacitor switch circuit (100) comprises a first controllable switch (111) being arranged between the second input node (E130a) of the differential operational amplifier (130) and the first current path (101). The at least one capacitor switch circuit (100) comprises a second controllable switch (112) being arranged (Continued)

between the first input node (E130a) of the differential operational amplifier (130) and the second current path (102).

8 Claims, 4 Drawing Sheets

(58) Field of Classification Search
USPC .................................................. 341/130–144
See application file for complete search history.

(56) References Cited

U.S. PATENT DOCUMENTS

| | | | |
|---|---|---|---|
| 5,541,599 | A | 7/1996 | Kasha et al. |
| 6,204,787 | B1 | 3/2001 | Baird |
| 6,927,720 | B2 * | 8/2005 | Matsumoto ........... H03M 3/344 |
| | | | 341/143 |
| 2003/0210166 | A1 | 11/2003 | Liu et al. |
| 2006/0109153 | A1 | 5/2006 | Gupta |
| 2011/0063146 | A1 | 3/2011 | Matthews et al. |
| 2012/0161994 | A1 | 6/2012 | Quiquempoix et al. |
| 2014/0253355 | A1 | 9/2014 | Quiquempoix |
| 2020/0083899 | A1 | 3/2020 | Horii |

FOREIGN PATENT DOCUMENTS

| | | |
|---|---|---|
| EP | 1755226 | 2/2007 |
| WO | 94/23502 | 10/1994 |

OTHER PUBLICATIONS

Office Action issued in European Application No. 17172740.7 dated Mar. 4, 2020, 11 pages.
Baird R. T. et al.: "Improved Sigma Delta DAC linearity using data weighted averaging" in Proc. IEEE Int. Symp. Circuits and Systems, vol. 1, May 1995, pp. 13-16.
Carley L. R. et al.: "A 16-bit 4th order noise shaping D/A converter" in Proc. IEEE Custom Integrated Circuits Conf.(CICC), 1988, pp. 21.7.-21.7.4.
Carley L. R.: "A noise-shaping coder topology for 15+bit converters" IEEE J. Solid-State Circuits, vol.24 No. 4, pp. 267-273, Apr.1989.
de Bock, M. et al.: "A double-sampling cross noise-coupled split sigma delta modulation A/D converter with 80dB SNR" IEEE Int'l Conf. on Electronics, Circuits and Systems, pp. 45-48, Dec. 2009.
European Patent Office, International Search Report for PCT/EP2018/059892 dated Jun. 18, 2018.
Hairapetian A. et al.: "Multibit sigma-delta modulator with reduced sensitivity to DAC nonlinearity" Electron. Lett., vol.27, No. 11, pp. 808-817, 1997.
Kim, M. et al.:"A 0.9V 92dB Double-Sampled Switched-RC Delta-Sigma Audio ADC" IEEE J. Solid-State Circuits, vol. 43, No. 5, May 2008.
Leslie, T. C. et al.: "An improved sigma-delta modulator architecture" in IEEE Int. Symp. Circuits and Systems, vol. 1, May 1990, pp. 372-375.
Leung, B. et al.: "Multibit Sigma Delta A/D converters incorporating a novel class of dynamic element matching technique" IEEE Trans. Circuits Syst. 2, Analog Digit. Signal Process., vol. 39, No. 1, pp. 35-51, Jan. 1992.
Li, B. et al.: " A Second Order Sigma Delta Modulator Using Semi-uniform Quantizer with 81dB Dynamic Range at 32x OSR" European Solid State Circuits Conference 2002, pp. 579-582.
Nagari, A. et al.: "A 2.7-v 11.8-mw baseband ADC with 72-db dynamic range for GSM applications" IEEE J. Solid-State Circuits, vol. 35, No. 6, pp. 798-806, Jun. 2000.
Norsworthy, S. et al.: "Delta-sigma data converters" in "Delta-sigma data converters" Jan. 1, 1996, IEEE Press. New York, XP055420022, ISBN: 978-0-470-54435-8, pp. 340-341.
Sarhang-Nejad M. et al.: "A high-resolution multi-bit Sigma Delta ADC with digital correction and relaxed amplifier requirements" IEEE Journal of Solid-State Circuits, vol. 28, pp. 648-660, Jun. 1993.
Senderowicz, D. et al.: "Low-voltage double-sampled sigma delta converters" IEEE J. Solid-State Circuits, vol. 32, No. 12, pp. 1907-1919, Dec. 1997.
Zhang Z. et al.: "Multi-bit Oversampled S-D A/D Converter with Nonuniform Quantization" Electronics Letters, 1991, vol. 27, No. 6, pp. 528-529.
Office Action issued in U.S. Appl. No. 16/615,505, dated May 7, 2020, 10 pages.
European oral proceedings in corresponding European Application No. 17172740.7 dated Nov. 19, 2020, 17 pages.
Krishnapura et al., "Lecture 7 Bottom Plate Sampling, The Gate Bootsrapped Switch", Youtube, uploaded on Mar. 20, 2012, retrieved from Internet: <https://www.youtube.comfwatch?v=_MGQvveBAew> by EPO examiner on or before Nov. 19, 2020, 1 page.

* cited by examiner

|  | pA | pB | pC | pD | pE | pF |
|---|---|---|---|---|---|---|
| +4 | p2d | p1d | off | p1 | p2 | off |
| +2 | p2d | p1d | off | p1 | off | p2 |
| +1 | p2d | off | p1d | off | p2 | p1 |
| 0 | p2d | off | off | off | off | on |
| −1 | p2d | off | p1d | p2 | off | p1 |
| −2 | p2d | p1d | off | off | p1 | p2 |
| −4 | p2d | p1d | off | p2 | p1 | off |

FIG 5

|    | $p_A$ | $p_B$ | $p_C$ | $p_D$ | $p_E$ |
|----|-------|-------|-------|-------|-------|
| +2 | $p_{1d}$ | $p_{2d}$ | off | $p_1$ | $p_2$ |
| +1 | $p_{1d}$ | off | $p_{2d}$ | $p_1$ | $p_2$ |
| 0  | off | off | $p_{1d}+p_{2d}$ | $p_1$ | $p_2$ |
| -1 | off | $p_{1d}$ | $p_{2d}$ | $p_1$ | $p_2$ |
| -2 | $p_{2d}$ | $p_{1d}$ | off | $p_1$ | $p_2$ |

MULTI-LEVEL CAPACITIVE DIGITAL-TO-ANALOG CONVERTER FOR USE IN A SIGMA-DELTA MODULATOR

TECHNICAL FIELD

The disclosure relates to a multi-level capacitive digital-to-analog converter for use in a sigma-delta modulator.

BACKGROUND

Sigma-delta modulators are widely used today in several electronic applications. A sigma-delta modulator (SDM) receives an analog input signal at an input terminal and outputs a digital value proportional to the analog input signal. A sigma-delta modulator usually uses a capacitive digital-to-analog converter (DAC) to realize the feedback path of the modulator, if the modulator uses an arrangement of switched capacitor circuits (SC).

Multi-bit sigma-delta modulators have higher resolution and better stability conditions than a single-bit sigma-delta modulator. However, a big challenge of a multi-bit sigma-delta modulator is realizing a linear multi-bit digital-to-analog converter. If there is a non-linearity in a multi-bit DAC in the feedback path of the modulator, there will be harmonic distortions of the input signal at the modulator output, and high frequency quantization noise will be brought down to the signal band due to aliasing, resulting in the noise floor increasing.

To solve this problem, dynamic element matching (DEM) may be used to reduce the sensitivity to DAC non-linearity. However, since DEM and other solutions cause digital complexity and circuit area increase, multi-bit sigma-delta modulators with DEM and other solutions are not suitable for area-limited analog-to-digital converters (ADCs) like pixel ADC in an analog front-end of imaging applications.

There is a need to provide a multi-level capacitive digital-to-analog converter with a large dynamic range and having a small area consumption.

SUMMARY

A multi-level capacitive digital-to-analog converter that is based on the use of simple circuits requiring a small area and that has a large dynamic range is specified in claim 1.

The multi-level capacitive digital-to-analog converter comprises at least one capacitor switch circuit having a first reference input terminal to apply a first reference potential and a second reference input terminal to apply a second reference potential. The at least one capacitor switch circuit includes a differential operational amplifier having a first input node and a second input node. The at least one capacitor switch circuit includes a first current path and a second current path. The first current path is coupled to the first reference input terminal, and the second current path is coupled to the second reference input terminal. The first input node of the differential operational amplifier is connected to the first current path and the second input node of the differential operational amplifier is connected to the second current path.

The at least one capacitor switch circuit comprises a first controllable switch being arranged between the second input node of the differential operational amplifier and the first current path. The at least one capacitor switch circuit comprises a second controllable switch being arranged between the first input node of the differential operational amplifier and the second current path.

DETAILED DESCRIPTION

Figure 1:
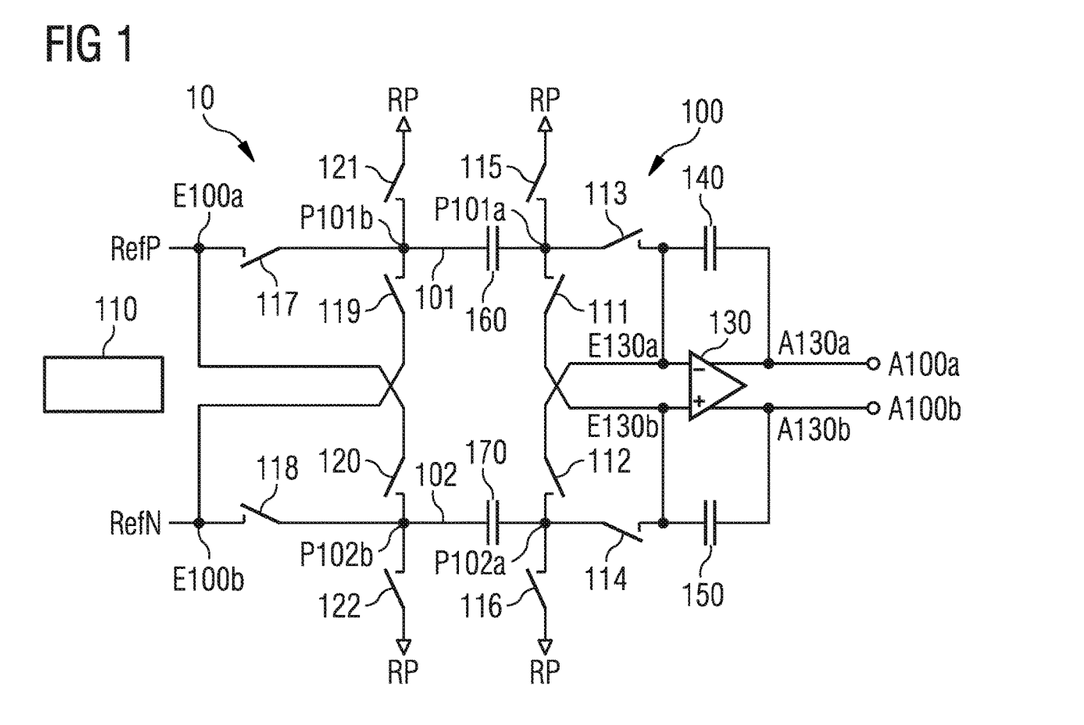
FIG. 1 shows an embodiment of a capacitive 7-level digital-to-analog converter with one capacitor unit.

FIG. 1 shows an embodiment of a multi-level capacitive digital-to-analog converter 10 with at least one capacitor unit being configured as a capacitor switch circuit 100. The at least one capacitor switch circuit 100 has a first reference input terminal E100a to apply a first reference potential RefP and a second reference input terminal E100b to apply a second reference potential RefN. The at least one capacitor switch circuit 100 includes a differential operational amplifier 130 having an input side with an input node E130a and an input node E130b. The at least one capacitor switch circuit 100 includes a current path 101 being coupled to the reference input terminal E100a to apply the reference potential RefP. The at least one capacitor switch circuit 100 further includes a current path 102 being coupled to the reference input terminal E100b to apply the reference potential RefN. The input node E130a of the differential operational amplifier is connected to the current path 101 and the input node E130b of the differential operational amplifier 130 is connected to the current path 102.

The at least one capacitor switch circuit 100 further comprises a controllable switch 111 being arranged between the input node E130a of the differential operational amplifier 130 and the current path 101. The at least one capacitor switch circuit 100 further comprises a controllable switch 112 being arranged between the input node E130a of the differential operational amplifier 130 and the current path 102.

The at least one capacitor switch circuit 100 further comprises an output terminal A100a and an output terminal A100b to generate an output signal between the output terminals A100a and A100b. The differential operational amplifier 130 has an output node A130a being connected to the output terminal A100a and an output node A130b being connected to the output terminal A100b. The at least one capacitor switch circuit 100 further comprises an integrating capacitor 140 and an integrated capacitor 150. The integrating capacitor 140 is arranged between the input node E130a and the output node A130a of the differential operational amplifier 130. The integrating capacitor 150 is arranged between the input node E130a and the output node A130b of the differential operational amplifier 130.

The at least one capacitor switch circuit 100 comprises a transfer capacitor 160 and a transfer capacitor 170. The transfer capacitor 160 is arranged in the current path 101 between the reference input terminal E100a and the integrating capacitor 140. The transfer capacitor 170 is arranged in the current path 102 between the reference input terminal E100b and the integrating capacitor 150.

The at least one capacitor switch circuit 100 comprises a controllable switch 113 and a controllable switch 114. The controllable switch 113 is arranged in the current path 101 between the integrating capacitor 140 and the transfer capacitor 160. The controllable switch 114 is arranged in the current path 102 between the integrating capacitor 150 and the transfer capacitor 170.

The at least one capacitor switch circuit 100 comprises a controllable switch 115 and a controllable switch 116. The controllable switch 115 is arranged between a reference potential RP and a position P101a of the current path 101. The position P101a of the current path 101 is located between the controllable switch 113 and the transfer capacitor 160. The controllable switch 116 is arranged between the reference potential RP and a position P102a of the current path 102. The position P102a of the current path 102 is located between the controllable switch 114 and the transfer capacitor 170.

The controllable switch 111 is arranged between the input node E130b of the differential operational amplifier 130 and the position P101a of the current path 101. The controllable switch 112 is arranged between the input node E130a of the differential operational amplifier 130 and the position P102a of the current path 102.

The at least one capacitor switch circuit 100 comprises a controllable switch 117 being arranged in the current path 101 between the reference input terminal E100a and the transfer capacitor 160. The at least one capacitor switch circuit 100 further comprises a controllable switch 118 being arranged in the current path 102 between the reference input terminal E100b and the transfer capacitor 170.

The at least one capacitor switch circuit 100 comprises a controllable switch 119 being arranged between the reference input terminal E100b and a position P101b of the current path 101. The position P101b of the current path 101 is located between the controllable switch 117 and the transfer capacitor 160. The at least one capacitor switch circuit 100 further comprises a controllable switch 120 being arranged between the reference input terminal E100a and a position P102b of the current path 102. The position P102b of the current path 102 is located between the controllable switch 118 and the transfer capacitor 170.

The at least one capacitor switch circuit 100 comprises a controllable switch 121 being arranged between the reference potential RP and the position P101b of the current path 101. The at least one capacitor switch circuit 100 comprises a controllable switch 122 being arranged between the reference potential RP and the position P102b of the current path 102.

The multi-level digital-to-analog converter is configured to transfer the signals in two operational phases, one for sampling signals and one for transferring signals to the next stage. The multi-level capacitive digital-to-analog converter 10 comprises a switching controller 110. The switching controller 110 is configured to control a conductive and non-conductive switching state of the controllable switches 111, 112, . . . , 122 by generating respective switching signals pA, pB, pC, pD, pE and pF. The switching controller 110 is configured to generate the switching signals pA, . . . , pF with a plurality of different signal sequences p1, p1d, p2, p2d, on and off of a first and second signal level during the first and the second operational phase of the multi-level capacitive digital-to-analog converter 10.

Figure 2:
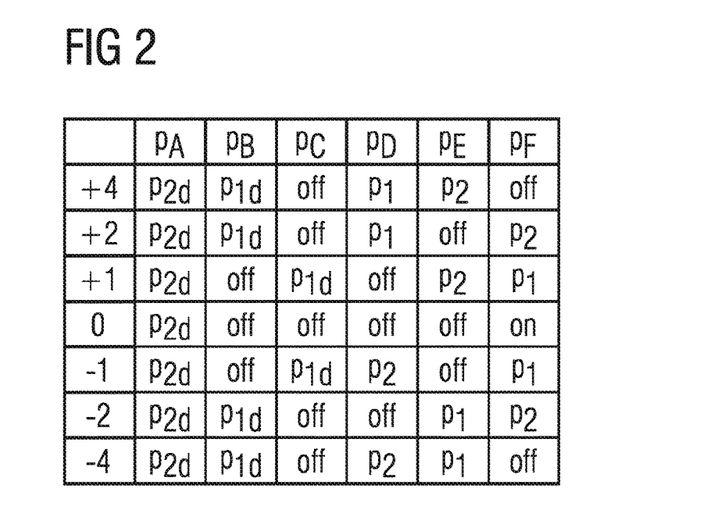
FIG. 2 shows a table with signal sequences of switching signals to control controllable switches of a capacitor unit of the 7-level digital-to-analog converter.

FIG. 2 shows a table including the switching signals pA, . . . , pF for controlling the controllable switches 111, . . . , 122 and the corresponding signal sequences p1, p1d, p2, p2d, on and off to realize the levels of the output signal of the multi-level digital-to-analog converter from −4, −2, −1, 0, +1, +2 and +4. The switching controller 110 generates the switching signal pA to control the controllable switches 117 and 118. The switching controller 110 generates the switching signal pB to control the controllable switches 119 and 120. The switching controller 110 generates the switching signal pC to control the controllable switches 121 and 122. The switching controller 110 generates the switching signal pD to control the controllable switches 113 and 114. The switching controller 110 generates the switching signal pE to control the controllable switches 111 and 112. The switching controller 110 generates the switching signal pF to control the controllable switches 115 and 116.

Figure 3:
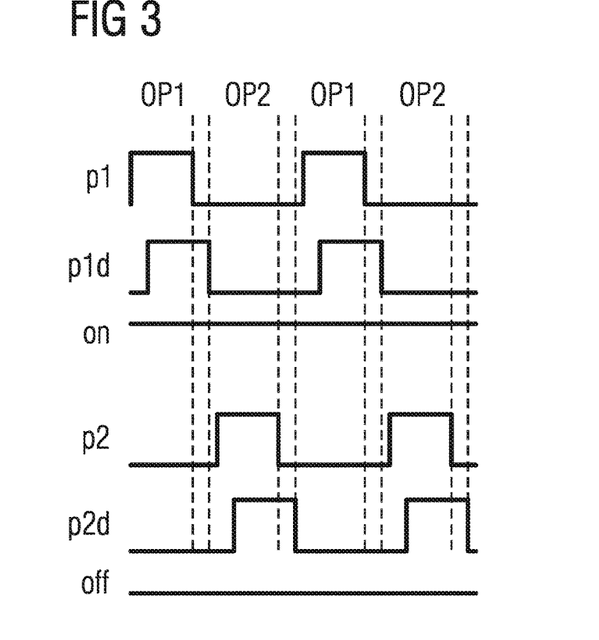
FIG. 3 shows signal sequences of the switching signals to control the controllable switches of a capacitor unit of the 7-level digital-to-analog converter.

FIG. 3 shows the different signal sequences p1, p1d, p2, p2d, on and off of a first and second signal level, i.e. a high and a low level, of the switching signals pA, . . . , pF during the first and the second operational phase OP1 and OP2 of the multi-level digital-to-analog converter. As shown in FIG. 3, the signal sequences p1 and p2 are configured as non-overlapping clocks, while the signal sequences p1d and p2d are delayed versions of the signal sequences p1 and p2.

The switching controller 110 is configured to generate the switching signals pA, . . . , pF, with a signal sequence p1 of the first and second signal level. The first sequence p1 of the signal levels has the first level, for example the high level, from a first instant of time of the first operational phase OP1 at the beginning of the first operational phase or after the beginning of the first operational phase until a second instant of time of the first operational phase OP1 before the instant of time of the end of the first operational phase OP1. The switching controller 110 generates the first signal sequence p1 of the signal levels with the second level, for example the low level, from the second instance of time of the first operational phase OP1 until the instant of time of the end of the first operational phase OP1 and during the second operational phase OP2.

The switching controller 110 is further configured to generate the switching signals pA, . . . , pF with a signal sequence p1d of the first and second signal level, for example a high and low signal level. The second signal sequence p1d has the first level, for example the high level, from a third instant of time of the first operational phase OP1 being after the first instant of time of the first operational phase until the instant of time of the end of the first operational phase OP1. The signal sequence p1d is generated with the second signal level, for example the low level, from the beginning of the first operational phase OP1 until the third instant of time of the first operational phase OP1 and during the second operational phase OP2.

The switching controller 110 is further configured to generate the switching signals pA, . . . , pF with a signal sequence p2 of the first and the second level, for example the high and the low level. The signal sequence p2 has the first level, for example the high level, from a first instant of time of the second operational phase OP2 at the beginning of the second operational phase OP2 or after the beginning of the second operational phase OP2 until a second instant of time of the second operational phase OP2 before the instant of time of the end of the second operational phase OP2. The signal sequence p2 has the second level, for example the low level, from the second instant of time of the second operational phase until the instant of time of the end of the second operational phase OP2 and during the first operational phase OP1.

The switching controller 110 is further configured to generate the switching signals pA, . . . , pF with a signal sequence p2d of the first and the second signal level, for example the high and the low signal level. The signal sequence p2d has the first level, for example the high level, from a third instance of time of the second operational phase OP2 being after the first instant of time of the second operational phase OP2 until the instant of time of the end of the second operational phase OP2. The signal sequence p2d is generated with the second signal level, for example the low level, from the beginning of the second operational phase OP2 until the first instant of time of the second operational phase OP2 and during the first operational phase OP1.

The switching controller 110 is further configured to generate the switching signals pA, . . . , pF with a signal sequence on and off. The signal sequence off means that the switching signal has the second signal level, for example the low signal level, during the first and the second operational phase. The signal sequence on means that the switching signal has the first signal level, for example the high signal level, during the first and the second operational phase.

The controllable switches 111, . . . , 122 are configured to be operated in the conductive state, when the respective switching signal pA, . . . pF has the first level, for example the high level. The controllable switches 111, . . . , 122 are configured to be operated in the conductive state, when the respective switching signal pA, . . . , pF has the second level, for example the low level.

The content of the table of FIG. 2 is explained by two examples for generating several levels of the output signal. The level +4 of the output signal is generated by the multi-level digital-to-analog converter 10 by generating the switching signal pA to control the controllable switches 117 and 118 with the signal sequence p2d. The switching signal pB to control the controllable switches 119 and 120 is generated by the switching controller 110 with the signal sequence pfd. The switching signal pC to control the controllable switches 121 and 122 is generated by the switching controller 110 with the signal sequence off. The switching controller 110 generates the switching signal pD to control the controllable switches 113 and 114 with the signal sequence p1. The switching controller 110 generates the switching signal pE to control the controllable switches 111 and 112 with the signal sequence p2. The switching signal pF to control the controllable switches 115 and 116 is generated by the switching controller 110 with the signal sequence off, i.e. the low level during the first and second operational phase.

As another example, the output signal "0" is generated by the multi-level digital-to-analog converter 10 by generating the switching signal pA from the switching controller 110 with the signal sequence p2d, and by generating the switching signals pB, pC, pD and pE from the switching controller 110 with the signal sequence off, i.e. the low level during the first and second operational phase OP1 and OP2. The switching signal pF is generated by the switching controller 110 with the signal sequence on, i.e. with the high level during the first and the second operational phase OP1 and OP2.

As shown in FIG. 2, the at least one capacitor switch circuit 100 of the multi-level capacitive digital-to-analog converter 10 is configured to generate seven levels of the output signal, i.e. the levels +4, +2, +1, 0, −1, −2 and −4. The multi-level capacitive digital-to-analog converter 10 may comprise a number N of the at least one capacitor switch circuit 100 shown in FIG. 1. The multi-level capacitive digital-to-analog converter 10 is configured to generate 8*N−1 levels of the output signal.

The output levels of the output signal of the multi-level capacitive digital-to-analog converter 10 are non-uniform. However, the all signal levels of the output signal can be realized except for the signal level "4*N−1" and "−4*N+1". Limiting to only uniform digital-to-analog converters, it is possible to realize levels of the output signal from "−4*N+2" to "4*N−2". This means that the multi-level digital-to-analog converter 10 in the configuration shown in FIG. 1 is configured to output 8*N−3 uniform signal levels. As an example, in the case of providing the multi-level digital-to-analog converter 10 with three of the at least one capacitor switch circuit 100, the output levels of the output signal are "+12, +10, +9, +8, +7, +6, +5, +4, +3, +2, +1, 0, −1, −2, −3, −4, −5, −6, −7, −8, −9, −10, −12". This means that the total number of output levels is 23, wherein 21 levels of the output signal of the 23 possible levels are uniform output levels.

In the configuration of the multi-level digital-to-analog converter 10 shown in FIG. 1, floating double sampling such as is described by Senderowicz et al., "Low-voltage double-sampled sigma delta converters" in IEEE J. Solid-State Circuits, vol. 32, no. 1, pp. 41-50, January 1997 is used to realize the output levels of the digital-to-analog converter 10 of "+4" and "−4". In a two operational phase system which is used in most of sigma-delta modulators, it is impossible to realize the output levels "+4", "−4" after the signal levels "+3", "−3", so that the digital-to-analog converter is not uniform. However, non-uniform quantization or semi-uniform quantization is useful to realize multi-bit sigma-delta modulators with large dynamic range.

A multi-bit sigma-delta modulator without using DEM is proposed in US 2014/0253355 A1. The multi-bit sigma-delta modulator comprises a multi-level capacitive digital-to-analog converter 20 using N capacitor switch circuits 200. The multi-level capacitive digital-to-analog converter 20 is configured to generate 4*N+1 levels of an output signal with N capacitor units 200. The multi-level capacitive digital-to-analog converter 20 may generate 5 levels of the output signal with one capacitor unit 200.

Figure 4:
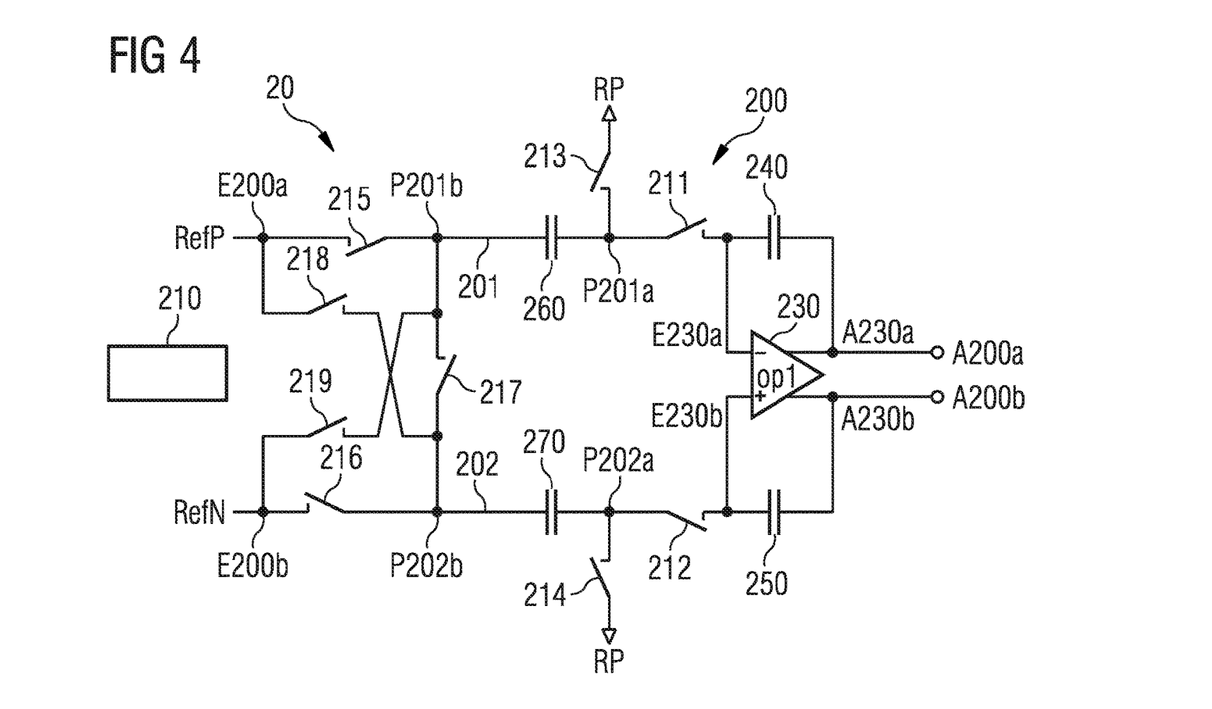
FIG. 4 shows an embodiment of a capacitive 5-level digital-to-analog converter with one capacitor unit.

An exemplified embodiment of such a capacitive 5-level digital-to-analog converter 20 with one capacitor unit 200 is shown in FIG. 4. The capacitor unit 200 comprises a differential operational amplifier 230 having an input node E230a and an input node E230b. The capacitor unit 200 includes a current path 201 being coupled to a reference input terminal E200a to apply a reference potential RefP and a current path 202 being coupled to a reference input terminal E200b to apply a reference potential RefN. The input node E230a of the differential operational amplifier 230 is connected to the current path 201. The input node E230b of the differential operational amplifier 230 is connected to the current path 202.

The capacitor unit 200 has an output terminal A200a and an output terminal A200b to generate an output signal between the output terminals A200a and A200b. The output node A200a of the differential operational amplifier 230 is connected to the output terminal A200a. The output node A230b of the differential operational amplifier 230 is connected to the output terminal A200b. The capacitor unit 200 comprises an integrating capacitor 240 being arranged between the input node E230a and the output node A230a of the differential operational amplifier 230. The capacitor unit 200 further comprises an integrating capacitor 250 being arranged between the input node E230a and the output node A230b of the differential operational amplifier 230.

The capacitor unit 200 further comprises a transfer capacitor 260 being arranged in the current path 201 between the reference input terminal E200a and the integrating capacitor 240. The capacitor unit 200 further comprises a transfer capacitor 270 being arranged in the current path 202 between the reference input terminal E200b and the integrating capacitor 250.

The capacitor unit 200 comprises a controllable switch 211 being arranged in the current path 201 between the integrating capacitor 240 and the transfer capacitor 260. Another controllable switch 212 is arranged in the current path 202 between the integrating capacitor 250 and the transfer capacitor 270. The capacitor unit 200 further comprises a controllable switch 213 being arranged between a reference potential RP and a position P201a of the current path 200 between the controllable switch 211 and the transfer capacitor 260. Another controllable switch 214 is arranged between the reference potential RP and a position P202a of the current path 202 between the integrating capacitor 250 and the transfer capacitor 270.

A controllable switch 215 is arranged in the current path 201 between the transfer capacitor 260 and the reference input terminal E200a to apply the reference potential RefP. A controllable switch 216 is arranged in the current path 202 between the reference input terminal E200b to apply the reference potential RefN and the transfer capacitor 270. A controllable switch 217 is arranged between the current path 201 and the current path 202. In particular, the controllable switch 217 is connected to a position P201b of the current path 201 between the controllable switch 215 and the transfer capacitor 260. The controllable switch 217 is further connected to a position P202b between the controllable switch 216 and the transfer capacitor 270.

The capacitor unit 200 comprise a controllable switch 218 being connected between the reference input terminal E200a and the position P202b of the current path 202. The capacitive unit 200 further comprises a controllable switch 219 being connected between the reference input terminal E200b and the position P201b of the current path 201.

Figure 5:
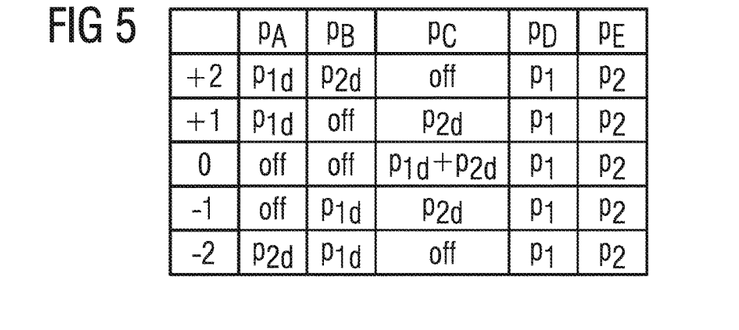
FIG. 5 shows a table with signal sequences of switching signals to control controllable switches of a capacitor unit of the 5-level digital-to-analog converter.

The controllable switches 211, . . . , 219 are controlled by a switching controller 210. FIG. 5 shows a table that illustrates signal sequences p1, p1d, p2, p2d, and off of switching signals pA, . . . , pE to control the controllable switches 211, . . . , 219. The switching signal pA is generated by the switching controller 210 to control the controllable switches 215 and 216. The switching signal pB is generated by the switching controller 210 to control the controllable switches 218 and 219. The switching signal pC is generated by the switching controller 210 to control the controllable switch 217. The switching signal pD is generated by the switching controller 270 to control the switching states of the controllable switches 213 and 214. The switching signal pE is controlled by the switching controller 210 to control the switching states of the controllable switches 211 and 212.

The table of FIG. 5 illustrates the controlling of the controllable switches 211, . . . , 219 with the switching signals pA, . . . , pE to generate the different output levels +2, +1, 0, −1, −2 of the output signal of the multi-level capacitive digital-to-analog converter 20. The table is explained by means of the controlling of the controllable switches 211, . . . , 219 to generate the output levels +2 and 0 of the output signal.

In order to generate the output level +2, the switching controller 210 generates the switching signal pA to control the controllable switches 215 and 216 with the signal sequence p1d shown in FIG. 3. The controllable switches 218 and 219 are controlled by the switching signal pB which has the signal sequence p2d. The controllable switch 217 is controlled by the switching signal pC having the signal sequence off. The switching controller 210 further generates the switching signals pD with the signal sequence p1 to control the controllable switches 213 and 214 and generates the switching signal pE to control the controllable switches 211 and 212 by the signal sequence p2.

In order to generate the output level 0 of the output signal by the multi-level capacitive digital-to-analog converter 20, the switching controller 210 generates the switching signals pA and pB with the signal sequence off and the switching signal pC with a combination of the signal sequences p1d and p2d. The controllable switches 213 and 214 are controlled by the switching signal pD having the signal sequence p1, and the controllable switches 211 and 212 are controlled by the control signals pE having the signal sequence p2.

Since the five-level DAC output of the multi-level capacitive digital-to-analog converter 20 is highly linear even if capacitors are not matched, DEM or other solutions to reduce sensitivity of the DAC non-linearity are not needed. Therefore, it is possible to implement a multi-bit sigma-delta modulator with a simple circuit and small area. However, if more than five levels of the output signal are needed, circuit complexity is increased. The embodiment of the multi-level capacitive digital-to-analog converter 20 uses N capacitors to realize 4*N+1 output levels of the output signal.

Figure 6:
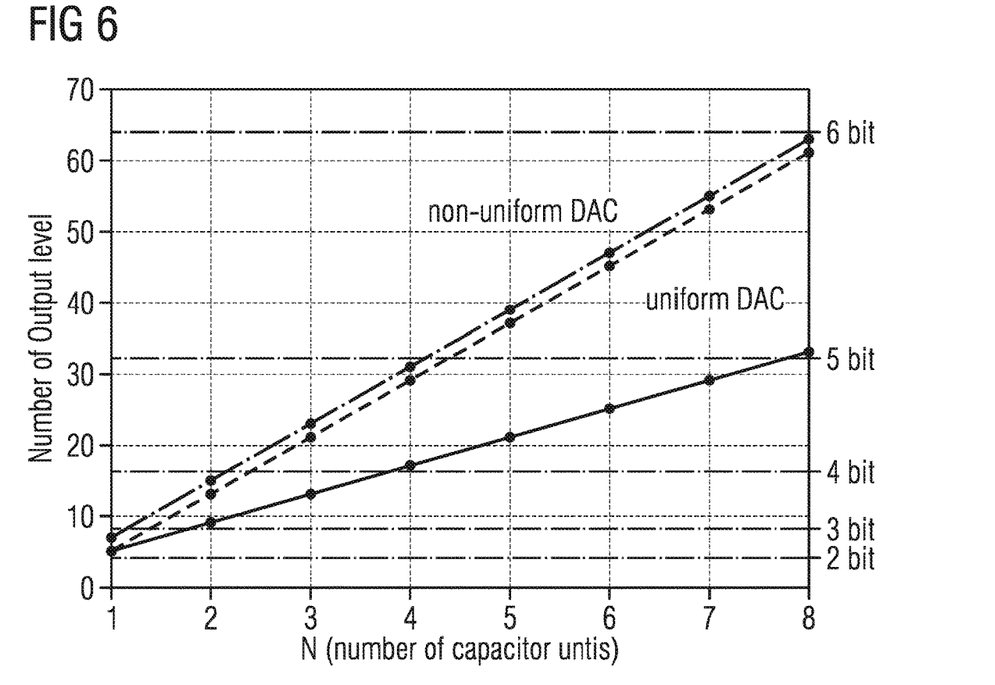
FIG. 6 shows a diagram illustrating output levels of a digital-to-analog converter versus capacitor units of a digital-to-analog converter.

FIG. 6 shows the number of DAC output levels versus the number of capacitor units/capacitor switch circuits 100 for the circuit configuration of the multi-level digital-to-analog converter 10 of FIG. 1 and the multi-level digital-to-analog converter 20 of FIG. 4. According to the graph of FIG. 6, the number of required capacitor switch circuits is reduced by almost half to realize the same resolution. This means that smaller area and simpler circuits are required for a sigma-delta modulator using the multi-level digital-to-analog converter 10.

Figure 7:
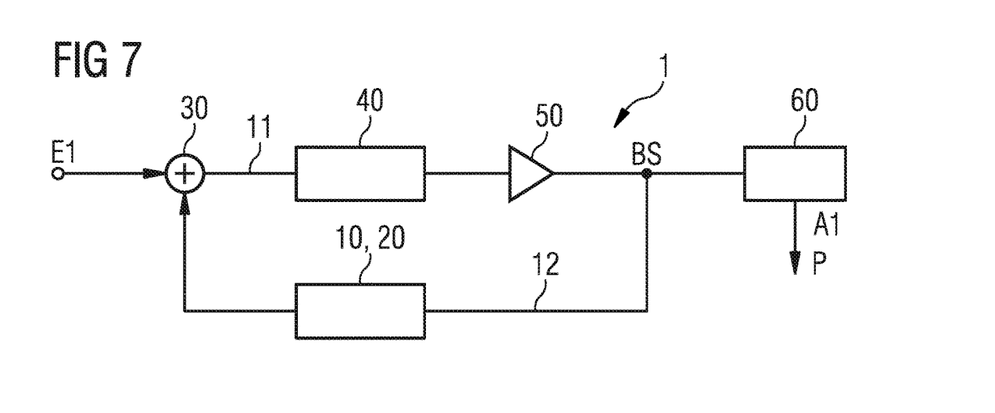
FIG. 7 shows a block diagram of an embodiment of a multi-bit sigma-delta modulator.

FIG. 7 shows an embodiment of a sigma-delta modulator 1 comprising an input terminal E1 to apply an analog input signal and an output terminal A1 to output a data word P in dependence on the analog input signal at the input terminal E1. The sigma-delta modulator 1 comprises a forward path 11 and a feedback path 12. The forward path 11 comprises a summation block 30, a loop filter 40 and a multi-bit quantizer 50. The feedback path 12 comprises the multi-level capacitive digital-to-analog converter 10 as shown in FIG. 1. The summation block 30 has a first input node E30a being connected to the input terminal E1 of the sigma-delta modulator and a second input node E30b being connected to the feedback path 12 to receive the output signal of the multi-level capacitive digital-to-analog converter 10. The sigma-delta modulator 1 further comprises a digital filter 60 that receives a bit stream BS at the output of the multi-bit quantizer 50 and generates the data word P at the output terminal A1.

Figure 8:
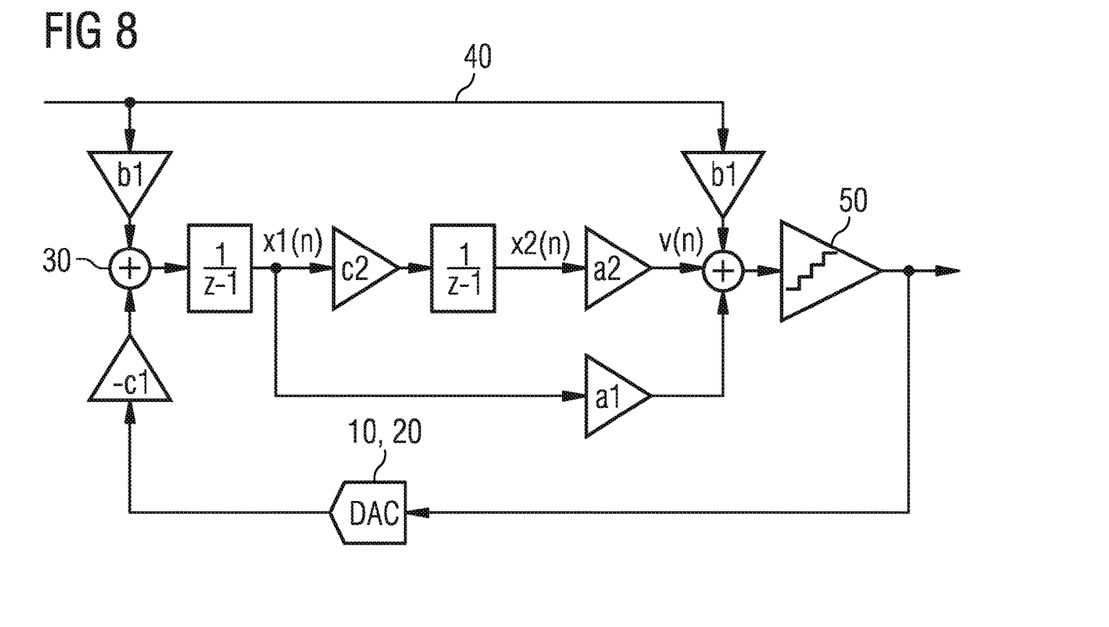
FIG. 8 shows a block diagram of a second order sigma-delta modulator based on Matlab models with a one-capacitor unit DAC.

FIG. 8 shows a block diagram of a second order sigma-delta modulator, wherein the different components of the sigma-delta modulator shown in FIG. 7 are reproduced by MATLAB model blocks. The digital-to-analog converter is realized by the embodiment 10 or 20 in order to compare the performance of both embodiments of the DACs 10 and 20. The multi-level DAC 10 and 20 respectively comprises one capacitor switch circuit 100, 200.

Figure 9:
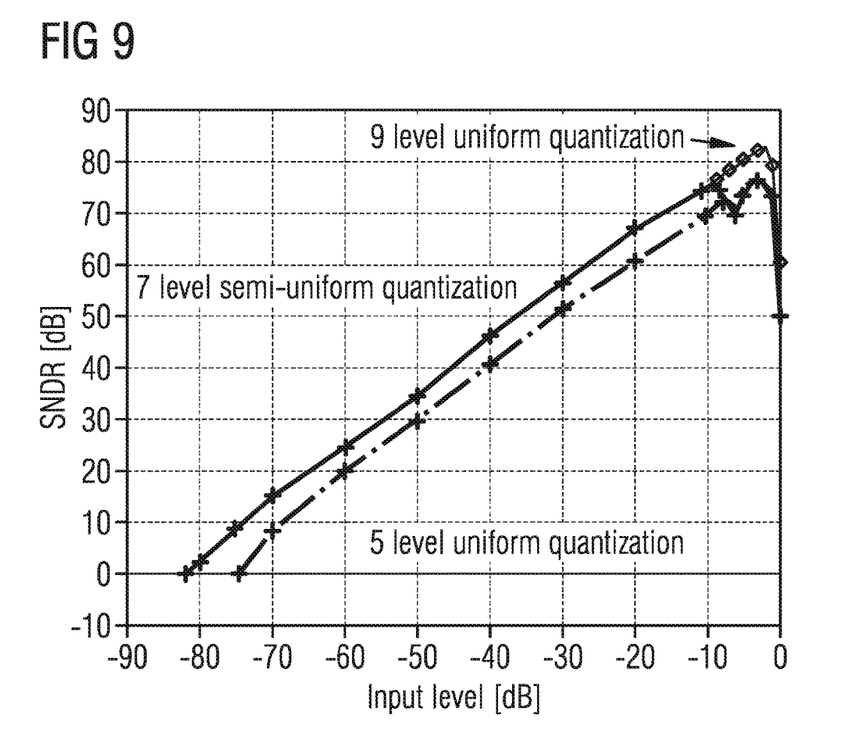
FIG. 9 shows a Signal-to-Noise and Distortion Ratio (SNDR) of the second order multi-bit sigma-delta modulator with different embodiments for a DAC.

The simulation results of the MATLAB model are shown in FIG. 9. Since the multi-level DACs 10 and 20 comprise only one capacitor switch circuit 100, 200, DEM is not required for these implementations. As shown in FIG. 9, the semi-uniform multi-level digital-to-analog converter 10 being configured as shown in FIG. 2, can achieve high dynamic range with same hardware complexity of a uniform DAC. Seen from the results of FIG. 9, the multi-level sigma-delta modulator comprising the 7-level semi-uniform DAC of FIG. 1 has the same dynamic range SDM with a 9-level uniform DAC, while the maximum Signal-to-Noise and Distortion Ratio (SNDR) is the same with the embodiment of the 5-level DAC of FIG. 4.

LIST OF REFERENCE SIGNS 1 sigma-delta modulator
10 multi-level capacitive DAC
20 multi-level capacitive DAC
30 summation block
40 loop filter
50 multi-bit quantizer
60 digital filter
100 capacitor switch circuit
110 switching controller
111, ..., 122 controllable switches
130 differential operational amplifier
140 first integrating capacitor
150 second integrating capacitor
160 first transfer capacitor
170 second transfer capacitor
200 capacitor switch circuit
210 switching controller
211, ..., 219 controllable switches
230 differential operational amplifier
240 first integrating capacitor
250 second integrating capacitor
260 first transfer capacitor
270 second transfer capacitor

The invention claimed is:

1. A multi-level capacitive digital-to-analog converter, comprising:
   at least one capacitor switch circuit having a first reference input terminal to apply a first reference potential and a second reference input terminal to apply a second reference potential, wherein the at least one capacitor switch circuit comprises:
      a differential operational amplifier having a first input node and a second input node,
      a first current path and a second current path, the first current path being coupled to the first reference input terminal and the second current path being coupled to the second reference input terminal,
         wherein the first input node of the differential operational amplifier is connected to the first current path and the second input node of the differential operational amplifier is connected to the second current path,
      a first controllable switch being arranged between the second input node of the differential operational amplifier and the first current path,
      a second controllable switch being arranged between the first input node of the differential operational amplifier and the second current path,
      a first integrating capacitor and a second integrating capacitor,
      a first transfer capacitor and a second transfer capacitor,
         wherein the first transfer capacitor is arranged in the first current path between the first reference input terminal and the first integrating capacitor, and
         wherein the second transfer capacitor is arranged in the second current path between the second reference input terminal and the second integrating capacitor,
      a third controllable switch and a fourth controllable switch,
         wherein the third controllable switch is arranged in the first current path between the first integrating capacitor and the first transfer capacitor, and
         wherein the fourth controllable switch is arranged in the second current path between the second integrating capacitor and the second transfer capacitor, a fifth and a sixth controllable switch,
         wherein the fifth controllable switch is arranged between a third reference potential and a first position of the first current path, said first position of the first current path being located between the third controllable switch and the first transfer capacitor,
         wherein the sixth controllable switch is arranged between the third reference potential and a first position of the second current path, said first position of the second current path being located between the fourth controllable switch and the second transfer capacitor,
         wherein the first controllable switch is arranged between the second input node of the differential operational amplifier and the first position of the first current path, and
         wherein the second controllable switch is arranged between the first input node of the differential operational amplifier and the first position of the second current path,
      a seventh controllable switch being arranged in the first current path between the first reference input terminal and the first transfer capacitor,
      an eighth controllable switch being arranged in the second current path between the second reference input terminal and the second transfer capacitor,
      a ninth controllable switch being arranged between the second reference input terminal and a second position of the first current path, said second position of the first current path being located between the seventh controllable switch and the first transfer capacitor,
      a tenth controllable switch being arranged between the first reference input terminal and a second position of the second current path, said second position of the second current path being located between the eighth controllable switch and the second transfer capacitor,
      an eleventh controllable switch being arranged between the third reference potential and the second position of the first current path, and
      a twelfth controllable switch being arranged between the third reference potential and the second position of the second current path.

2. The multi-level capacitive digital-to-analog converter of claim 1, wherein the at least one capacitor switch circuit comprises a first output terminal and a second output terminal to generate an output signal between the first and second output terminal, wherein the differential operational amplifier comprises a first output node being connected to the first output terminal and a second output node being connected to the second output terminal, wherein the first integrating capacitor is arranged between the first input node and the first output node of the differential operational amplifier, and wherein the second integrating capacitor is arranged between the second input node and the second output node of the differential operational amplifier.

3. The multi-level capacitive digital-to-analog converter of claim 2, wherein the at least one capacitor switch circuit is configured to generate 7 levels of the output signal.

4. The multi-level capacitive digital-to-analog converter of claim 2, comprising:

a number N of the at least one capacitor switch circuit, wherein the multi-level capacitive digital-to-analog converter is configured to generate 8*N−1 levels of the output signal.

5. The multi-level capacitive digital-to-analog converter of claim 1, comprising:

a switching controller being configured to control one of a conductive switch state and a non-conductive switching state of the controllable switches by generating respective switching signals.

6. The multi-level capacitive digital-to-analog converter of claim 5, wherein the switching controller is configured to generate the switching signals with a plurality of different signal sequences of a first signal level and a second signal level of the switching signals during a first operational phase and a second operational phase of the multi-level capacitive digital-to-analog converter.

7. The multi-level capacitive digital-to-analog converter of claim 6, wherein the controllable switches are configured to be operated in the conductive state, when the respective switching signal has the first signal level, and wherein the controllable switches are configured to be operated in the non-conductive state, when the respective switching signal has the second signal level.

8. A sigma delta modulator, comprising:

an input terminal to apply an analog input signal, forward path comprising a summation block, a loop filter and a multi-bit quantizer, a feedback path comprising a multi-level capacitive digital-to-analog converter of claim 1, wherein the summation block has a first input node being connected to the input terminal and a second input node being connected to the feedback path.

* * * * *